United States Patent
Heerden et al.

(10) Patent No.: US 8,882,301 B2
(45) Date of Patent: Nov. 11, 2014

(54) METHOD FOR LOW TEMPERATURE BONDING OF ELECTRONIC COMPONENTS

(75) Inventors: David Van Heerden, Baltimore, MD (US); Ramzi Vincent, Columbia, MD (US); Timothy Ryan Rude, Salt Lake City, UT (US)

(73) Assignee: NanoFoil Corporation, Utica, NY (US)

( * ) Notice: Subject to any disclaimer, the term of this patent is extended or adjusted under 35 U.S.C. 154(b) by 907 days.

(21) Appl. No.: 12/674,804

(22) PCT Filed: Aug. 29, 2008

(86) PCT No.: PCT/US2008/074809
§ 371 (c)(1),
(2), (4) Date: Nov. 24, 2010

(87) PCT Pub. No.: WO2009/029804
PCT Pub. Date: Mar. 5, 2009

(65) Prior Publication Data
US 2011/0089462 A1    Apr. 21, 2011

Related U.S. Application Data

(60) Provisional application No. 60/969,534, filed on Aug. 31, 2007.

(51) Int. Cl.
*F21V 29/00* (2006.01)
*H01L 33/00* (2010.01)
(Continued)

(52) U.S. Cl.
CPC ...... *H05K 3/3494* (2013.01); *H05K 2203/0278* (2013.01); *H05K 1/0203* (2013.01); *H05K 1/056* (2013.01); *H05K 2203/0405* (2013.01);
(Continued)

(58) Field of Classification Search
USPC ........ 257/712; 428/635, 596, 938; 149/108.2, 149/108.6; 362/294, 800; 361/704
See application file for complete search history.

(56) References Cited

U.S. PATENT DOCUMENTS 5,311,057 A    5/1994  McShane
6,517,218 B2 *  2/2003  Hochstein ............... 362/294
(Continued)

FOREIGN PATENT DOCUMENTS

JP    1993-036868    2/1993
JP    5-218139 A     8/1993
(Continued)

OTHER PUBLICATIONS

Search Report and Written Opinion of International Application No. PCT/US2008/074809, filed Aug. 29, 2008.

*Primary Examiner* — Kevin M Picardat
*Assistant Examiner* — Tsz Chiu
(74) *Attorney, Agent, or Firm* — Polster, Lieder, Woodruff & Lucchesi, L.C.

(57) ABSTRACT

A method for bonding an LED assembly (71) or other electronic package (31) to a substrate PCB containing a heat-sink (52), which utilizes layers of reactive multilayer foil (51) disposed between contacts (32, 34) of the electronic package 31 and the associated contact pads (55) on the supporting substrate PCB. By initiating an exothermic reaction in the reactive multilayer foil (51), together with an application of pressure, sufficient heat is generated between the contacts (32, 34) and the associated contact pads (55) to melt adjacent bonding material (54) to obtain good electrically and thermally conductive bonds between the contacts 32, 34 and contact pads (55) without thermally damaging the electronic package (31), heat-sensitive components (35) associated with the electronic package (31), or other the supporting substrate PCB.

1 Claim, 4 Drawing Sheets

(51) Int. Cl.
 *H05K 1/02* (2006.01)
 *H05K 1/05* (2006.01)
 *H05K 3/34* (2006.01)

(52) U.S. Cl.
 CPC ...... *H05K 2203/1163* (2013.01); *H05K 3/3436* (2013.01); *H05K 2201/10689* (2013.01); *H05K 2201/10106* (2013.01); *H05K 2201/10719* (2013.01); *H05K 2201/10734* (2013.01); *H05K 3/341* (2013.01); *H05K 2201/10969* (2013.01); *H05K 3/3421* (2013.01); *Y10S 362/80* (2013.01)
 USPC ............. 362/294; 257/712; 257/706; 257/99; 362/373; 362/800; 361/704

(56) References Cited

U.S. PATENT DOCUMENTS

| | | | |
|---|---|---|---|
| 6,736,942 | B2 | 5/2004 | Weihs et al. |
| 2002/0182436 | A1* | 12/2002 | Weihs et al. .................. 428/635 |
| 2003/0160021 | A1* | 8/2003 | Platt et al. ........................ 216/2 |
| 2008/0002367 | A1* | 1/2008 | Gilliland et al. .............. 361/709 |

FOREIGN PATENT DOCUMENTS

| | | |
|---|---|---|
| JP | 2003-531758 A | 10/2003 |
| JP | 2007-502214 A | 2/2007 |
| JP | 2007-511369 A | 5/2007 |

* cited by examiner

METHOD FOR LOW TEMPERATURE BONDING OF ELECTRONIC COMPONENTS

CROSS-REFERENCE TO RELATED APPLICATIONS

The present application is the United States National Stage under 35 U.S.C. §371 of International Application Serial No. PCT/US2008/074809, having an International Filing Date of Aug. 29, 2008 and is related to, and claims priority from, U.S. Provisional Patent Application Ser. No. 60/969,534, filed on Aug. 31, 2007, which is herein incorporated by reference.

STATEMENT REGARDING FEDERALLY SPONSORED RESEARCH

Not Applicable.

BACKGROUND OF THE INVENTION

The present invention is related generally to methods for bonding semiconductor devices to substrates, and in particular, to a method for low temperature solder bonding of temperature sensitive devices such as light-emitting diode (LED) assemblies to a substrate containing a heat sink, without exposing the entire semiconductor device or the adjacent substrate to damaging heat.

Light-emitting diodes, or LED's, are semiconductor light emitting components that are increasingly replacing incandescent bulbs in many lighting application. As shown in FIG. 1, a prior art typical LED assembly consists of an LED chip (not shown) encased in a protective package 31 (LED package). Two or more connection leads 34 with feet 36 extend from the sides of the package 31. A thermally coupling slug 32, commonly formed from copper, is disposed at the base of the LED package 31 and is coated with a wetting layer 33 to facilitate bonding to a substrate which incorporates a heat sink such as a metal core printed circuit board (MCPCB) (not shown in FIG. 1). A lens 35 may be attached to the top of the LED package 31 for directing emitted light. An exemplary LED package 31 may have dimensions of approximately 5 mm width×5 mm length by 2 mm height, without the lens 35.

For economic fabrication the LED package 31, the lens 35, and the MCPCB substrate desirably comprise polymer or plastic materials. The MCPCB substrate is typically a printed circuit board that includes a metal core within one or more layers of dielectric material. Copper traces and pads are disposed outside the dielectric material, and a solder mask is disposed surrounding the copper pads and covering the traces. FIG. 2 shows a typical pad pattern to match the connection leads 34 and slug 32 of the LED package 31 shown in FIG. 1. For operation of the LED package 31, the slug 32 is bonded to pad 55b while the two leads 34 are each bonded to an associated pad 55a.

In one conventional bonding process, the various bonds between the LED package 31 and the MCPCB pads 55a, 55b are formed by a high temperature solder reflow process. However, polymer lenses 35 may be damaged by the solder reflow process due to exposure to the high temperature reached during the solder reflow, and particularly to the high temperatures used with lead-free solder reflow procedures. Similarly, where large heat sinks are needed, plastic packaging and the LED semiconductor electronics may be damaged by reflow heating because the thermal mass of the heat sinks necessitates a lengthy solder reflow cycle at an elevated temperature. If the solder reflow cycle is not long enough, poor bonding may result due to inadequate melting of the solder. In addition, the high temperature of reflow may adversely affect the brightness of the LED or the lifetime of the device.

Alternatively, the connection leads 34 may be soldered individually using laser or hot bar (thermode) soldering and the center slug 32 may be attached with a thermally conductive adhesive. An electrical connection between the center slug 32 and the pad 55b is not needed, but since the center slug 32 serves to convey heat from the LED package 31 to the metal-core PCB, there must be low thermal resistance between the center slug 32 and the MCPCB. Thermally conductive adhesives have reasonable but limited thermal conductivity, and suffer from inconsistent viscosity during application which can lead to varying bond line thicknesses. If the thickness of the bond line between the center slug 32 and the pad 55b is too great, the thermal resistance of the bond increases. In extreme situations, the thickness of the bond at the center slug 32 can be so great that the feet 36 of the connection leads 34 fail to contact the pads 55a, making laser soldering difficult or impossible. Consequently, conventionally fabricated LED assemblies often fall short of their potential thermal, electronic and optical performance potential.

The same problems may occur in other electronic components and semiconductor packages with integrated thermal management pads or slugs that must be bonded to an external heat sink, and which are sensitive to high bonding temperatures. Such components and packages include but are not limited to electrolytic capacitors, power amplifiers, and photovoltaic devices. Many components that were designed for lead-tin eutectic solders are damaged at the higher reflow temperatures required for the use of lead-free solders.

Accordingly, it would be advantageous to provide a uniform and reliable method for bonding electronic packages, such as semiconductor devices and LEDs which are sensitive to extreme bonding temperatures, to a supporting substrate. It would be further advantageous to provide such a bonding method which does not generate excessive heat outside of the bonding region, and which results in bonds having a uniform thickness and strength, and which are capable of conducting electrical current and thermal energy.

BRIEF SUMMARY OF THE INVENTION

In one embodiment, the present invention sets forth a method for bonding an LED assembly or other electronic package to a substrate containing a heat-sink, which utilizes layers of reactive multilayer foil disposed between the LED assembly connecting leads, center slug, and the associated contact pads on the supporting substrate. By initiating an exothermic reaction in the reactive multilayer foil, together with an application of pressure, sufficient heat is generated between the connecting leads, center slug, and the associated contact pads to melt adjacent solder material to obtain good electrically and thermally conductive bonds between the connecting leads, center slug, and contact pads without thermally damaging the LED assembly, heat-sensitive electronic package, or other heat-sensitive components such as polymer lenses.

In an alternate embodiment the present invention sets forth an electronics package, such as an LED assembly, bonded to a supporting substrate by one or more bonds which include the remnants of reacted foils of reactive composite material.

DETAILED DESCRIPTION

The following detailed description illustrates the invention by way of example and not by way of limitation. The description enables one skilled in the art to make and use the present disclosure, and describes several embodiments, adaptations, variations, alternatives, and uses of the present disclosure, including what is presently believed to be the best mode of carrying out the present disclosure.

In general, the present disclosure sets forth a method for bonding various contacts between electronic packages, such as LED packages, semiconductor devices, or photovoltaic devices, and their supporting substrates such as metal-core printed circuit boards, using pieces or segments of reactive multilayer foils to provide sufficient thermal energy to melt and flow connecting bonding materials, such as solder, without damaging adjacent heat-sensitive components in the electronic packages or supporting substrates. Throughout this specification, the numerous descriptions and examples are described in the context of LED packages, but are not limited thereto, will readily be understood to be equally applicable to a wide variety of electronic devices, particularly those which are sensitive to damage by excess heat or thermal energy. Additional types of electronic packages which may be suitably bonded utilizing the methods of the present disclosure include flip chips, chip-on-board, bare dies, chip scale packages, package on package, ball grid arrays, fine-pitch no-lead, leadless chip carriers, quad flat packs, plastic leaded chip carriers, flat leads, small outline packages, DPAKs, and D2PAKs.

Figure 3:
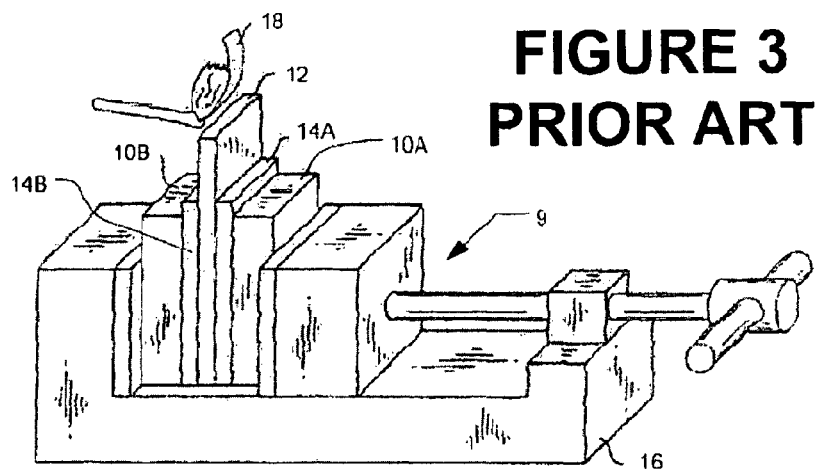
FIG. 3 is an illustration of prior art reactive multilayer bonding process.

The reactive multilayer foils utilized in the bonding methods of the present disclosure are typically formed by magnetron sputtering and consist of thousands of alternating nanoscale layers of materials, such as nickel and aluminum. The layers react exothermically when atomic diffusion between the layers is initiated by an external energy pulse, and release a rapid burst of heat in a self-propagating reaction. If the reactive multilayer foils are sandwiched between layers of a bonding material, such as a solder or braze alloy, the heat released by the exothermic reaction of the reactive multilayer foils can be harnessed to melt these layers of bonding material, as is illustrated in FIG. 3. The resulting bonding layer comprises a solder or braze layer that includes the reaction products of the reactive multilayer foil. By controlling the properties of the reactive multilayer foils, the amount of heat released by the reactive multilayer foils during the exothermic reaction can be tuned to ensure there is sufficient heat to melt the bonding material layers, but at the same time maintain the bulk of the adjacent components at or close to room temperature. Further details concerning reactive multilayer foils, bonding with them and their reaction products can be found in U.S. Pat. No. 6,736,942 which is incorporated herein by reference.

Turning to FIG. 3, an arrangement 9 is shown for performing the general process of reactive multilayer joining of two components 10A and 10B. A discrete sheet, piece, or segment of reactive composite material 12, such as a reactive multilayer foil, is disposed between two sheets or layers of fusible bonding material 14A and 14B, typically solders or brazes which, in turn, are sandwiched between the contact surfaces (not visible) of the components 10A and 10B. The sandwiched assembly is then pressed together, as symbolized by vise 16, and the reactive multilayer foil is ignited by any suitable means, as is illustrated by a match and flame 18. The reaction propagates rapidly through the reactive multilayer foil 12, melting the fusible bonding material 14A and 14B, which subsequently cools, joining the components 10A and 10B together at the contact surfaces. The bond areas contemplated herein may range from 0.25 mm$^2$ up to many square centimeters.

Figure 4:
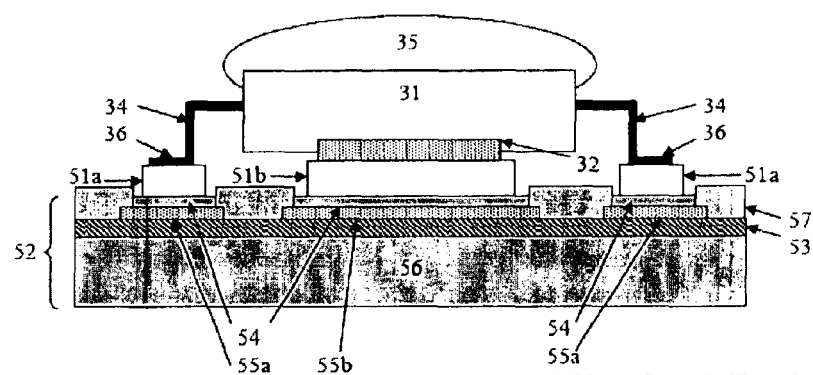
FIG. 4 is a schematic illustration of an LED package bonded to a PCB using the methods of the present disclosure.

Referring to FIG. 4, in one embodiment of the invention, an electronic device such as an LED package 31, having a center slug 32 and at least one connection lead 34 is bonded at one or more contacts to a metal-core printed circuit board 52 using a bonding method employing reactive multilayer foils. For example, the LED package 31, having a plurality of contacts defined by a center slug 32 and plurality of connection leads 34 is bonded to corresponding contacts of a printed circuit board (PCB) 52 defined by the pads 55$a$ and 55$b$ using reactive multilayer joining.

As shown in FIG. 4, the PCB 52 comprises a metal core 56, typically aluminum, a dielectric layer 53, and pads 55$a$ and 55$b$. Surrounding and partially covering the pads 55$a$ and 55$b$ is a polymer solder mask 57. The pads 55$a$ and 55$b$ may be formed from copper, and may optionally be coated with a surface layer 54 of bonding material, such as tin applied by hot air solder leveling (HASL) to form a tin layer that is typically 4 μm to 8 μm thick. Those of ordinary skill in the art will recognize that the surface layer 54 may be selected from any of a variety of conventional surface treatments, including immersion tin, electroless nickel/immersion gold (ENIG), lead-tin HASL, immersion silver, electroless palladium/gold, electrolytic nickel/gold, reflowed tin/lead, or any other surface treatment known in the art.

Advantageously, the LED package connection leads 34 and center slug 32 are similarly coated with a layer of bonding material, such as tin between 4 μm and 30 μm thick. As with the surface layer 54, the layer of bonding material on the connection leads 34 and center slug 32 of the LED package 31 may be any suitable bonding material such as a solder, solder alloy, or braze, and may be applied via electroplating, dipping, or any common method known in the art. Such solders and brazes include but are not limited to pure metals and alloys of indium, silver, and lead, as well as commercial alloys such as Georo® and Incusil®.

Traditionally, pure tin has not been commonly used as a bonding material due to its high melting point, but the method of the present disclosure enables the use of pure tin as a solder or bonding material, providing the advantage of higher ductility when compared to other bonding materials such as lead-free solder alloys.

To bond the center slug 32 and the connection leads 34 to pads 55, one or more pieces of a reactive multilayer foil 51 are placed between the contacts, i.e., between the connection lead feet 36 and their adjacent pads 55$a$, and between the center slug 32 and the adjacent pad 55$b$. A load designed to hold the contact surfaces against the reactive multilayer foils 51 is applied to each connection lead foot 36, and to the LED package 31 to exert a load on the center slug 32. Concurrently, an energy pulse is applied to each piece of reactive multilayer foil 51 which is sufficient to initiate an exothermic reaction therein. The resulting exothermic reaction of each piece of reactive multilayer foil 51 generates sufficient thermal energy to melt the surrounding bonding material or surface layer 54, which solidifies upon cooling to bond the connection leads 34 and center slug 32 of the electronic device to their respective pads 55 on the supporting substrate or printed circuit board 52. The thermal energy generated by the reaction of the reactive multilayer foil is not sufficient to raise the temperature of the adjacent LED package or supporting substrate (printed circuit board 52) appreciably above ambient temperature.

Advantageously, the discrete segments of reactive multilayer foil 51a and 51b are sized to fit within the polymer solder mask 57 which surrounds each pad 55 on the supporting substrate. Preferably, for the exemplary LED package 31 described above and shown in the figures, the applied load results in a pressure which is between 10 MPa and 100 MPa on each connection lead foot 36, and between 1 MPa and 9 MPa on the LED package 31 (to apply a load to the center slug 32). If the applied pressures are too low, the bonds resulting from the exothermic reaction of the reactive multilayer foil 51 may be weak. If the applied pressures are too high, the printed circuit board 56, connection leads 34, or LED package 31 may be damaged, and molten bonding material may be extruded from the bonding region during the exothermic reaction of the reactive multilayer foils 51.

Figure 5:
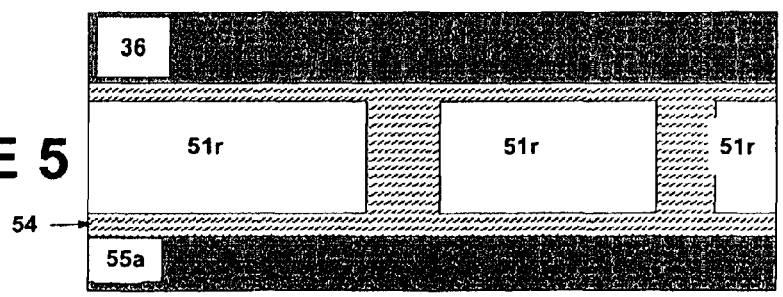
FIG. 5 illustrates a simplified cross-section of a bond formed by the method of the present disclosure, incorporating remnants of a reactive multilayer foil.

The resulting bond which is formed, such as between the adjacent contact surfaces of the connection lead feet 36 and the pad 55a, as shown in FIG. 5, incorporates the remains 51r of the reactive multilayer foil 51, which typically comprise a nickel aluminide. During the exothermic reaction, the reactive multilayer foil 51 typically cracks across its thickness to form smaller pieces and the bonding material and surface layer 54, such as tin or other fusible material, flows through the cracks to fill them, resulting in a distinctive microstructure shown schematically in FIG. 5.

The supporting substrate 52 or printed circuit board (PCB) may be another variety of printed circuit board, including but not limited to fiberglass, FR4, polybutadiene, or PTFE. The supporting substrate may comprise multiple layers of dielectric and copper pads. Alternatively, the electronic device or LED package 31 may be bonded to a metal heat sink or a flex-circuit material.

Figure 6A:
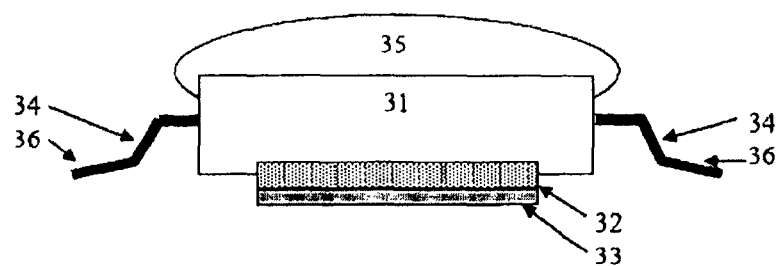
FIGS. 6A and 6B shows two different prior art LED package lead geometries.
Figure 6B:
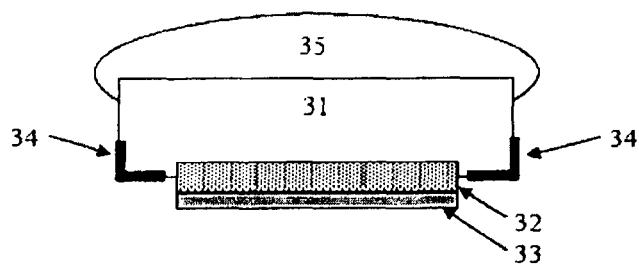

Those of ordinary skill in the art will recognize that the electronic device or LED package connection leads 34 may be any of a variety of shapes, including but not limited to gull-wing leads, as shown in FIG. 6a, a "leadless" configuration as shown in FIG. 6b, J-leads, or flat leads. Ball grid arrays for connection of the electronic device or LED package 31 may also be bonded using the methods of the present invention. Preferably, a large fraction of the surface or contact area of each connection lead foot 36 is parallel to the corresponding connection pad 55 on the supporting substrate 52, as shown in FIG. 4, to provide for a large area in contact with the reactive multilayer foil 51 to produce a strong bond. Advantageously, the area is selected to be greater than 50% of the area of the connection lead foot 36.

During the bonding process, the load to the electronic device 31 and connection leads 34 is preferably applied with a compliant element such as a spring, elastomer or foam, configured to maintain at least 80% of the initial load during and after the initiation of the exothermic reaction in the segments of reactive multilayer foil 51. The compliant element advantageously responds to any increase or decrease in thickness of the reactive multilayer foil 51, bonding materials, and surface layers 54 while the materials are molten in order to ensure sufficient contact is maintained throughout the duration of the bonding process.

In a related embodiment of the present disclosure, only a portion of the bonds between the electronic device or LED package 31 and the supporting substrate 52 are formed using the exothermic reaction of segments of reactive multilayer foil 51, and the remaining bonds are formed using any conventional bonding process. For example, the center slug 32 may be bonded by reactive multilayer joining and the connection lead feet 36, which may be displaced from potentially heat-sensitive components of the electronic device 31 may be bonded by another method known in the art, such as laser soldering, gap welding, or hot-bar (thermode) soldering. In a similar embodiment, the connection lead feet 36 may be bonded by reactive multilayer joining while the center slug 32 is bonded by another method known in the art, such as with thermally conductive epoxy.

In a related embodiment, either the contacts such as the pads 55, the connection leads 34, or the center slug 32, are not coated with 4 μm to 30 μm of a tin alloy, but are instead prepared with a wettable surface layer, such as gold, silver, or palladium. For this embodiment, a fusible bonding material such as a tin-based solder alloy is advantageously combined with the pieces of reactive multilayer foil 51, by magnetron sputtering, warm cladding, electroplating, or other methods known in the art. Preferably, a layer of fusible bonding material is adhered to one or both major surfaces of a piece of reactive multilayer foil 51. Alternatively, the fusible bonding material may be in the form of a free-standing preform. Fusible bonding material may be disposed on one or both sides of the reactive multilayer foil 51. The fusible bonding material is placed adjacent the wettable surface layer and the bonding process is carried out as described above by the exothermic reaction of the reactive multilayer foil 51. For good adhesion and strength, the total thickness of fusible bonding material in a bond, including any bonding material layer on the surfaces of the connection leads 34, center slug 32, and copper pads 55, should be at least 6 μm. More fusible bonding material can accommodate surface roughness or unevenness and improve reliability. The practical upper limit on fusible bonding material thickness is determined by the amount of heat provided by the exothermic reaction of the reactive multilayer foil 51 (because too little heat will not melt the fusible bonding material and form the bond), or by the escape of fusible bonding material from the bond area (which increases with increasing fusible bonding material thickness). This escape is undesirable because it may lead to short circuits or damage to the LED package or supporting substrate. Thus, the fusible bonding material thickness should be kept below 100 μm, and preferably below 50 μm.

Fusible bonding materials appropriate for combining with reactive multilayer foil include but are not limited to pure metals and alloys of tin, indium, silver, gold, and lead. In a related embodiment, the fusible bonding material may be a higher melting-point alloy such as Georo® or Incusil® which is advantageous when a ceramic substrate or printed circuit board is used in place of the metal-core PCB (MCPCB) described above, for high-temperature applications.

In another related embodiment, the pads 55, the leads 34, the center slug 32, or any combination, may be coated with a tin alloy or other fusible bonding material and a fusible bonding material may also be present on the surfaces of the pieces of reactive multilayer foil 51 before the bonding process. The addition of tin or solder layers to the reactive multilayer foil 51 allows good bonding with lower pressure than is necessary in the absence of such layers.

Figure 7:
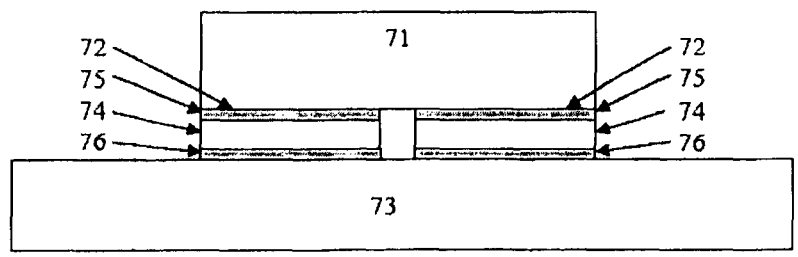
FIG. 7 shows a bare LED package bonded to a substrate.

In another embodiment, illustrated in FIG. 7, the LED device 31 is not encased in a ceramic or polymer package with a copper slug 32, but instead is in the form of a bare die 71, comprising silicon or another semiconductor material. The contact areas to be bonded 72 are nickel and gold plated, and the silicon is bonded to a printed circuit board or supporting substrate 73 via the reactive multilayer joining process of the present disclosure using pieces of reactive multilayer foil 74 including a layer of fusible material 75 on the side facing the LED bare die 71. If the supporting substrate 73 does not have adequate fusible bonding material in the bonding contact regions, the reactive multilayer foil 74 may further include a second layer of fusible bonding material 76 on the side facing the supporting substrate 73.

In another embodiment, the LED package 31 contains multiple LED dies 71. Each LED die 71 may have its own copper slug 32 and connection leads 34 or it may not.

The following example describe exemplary results for bonding electronic devices to supporting substrates utilizing the methods of the present disclosure. It will be recognized that these examples are for illustrative purposes, and are not intended to limit the scope of the present disclosure in any way.

Figure 1:
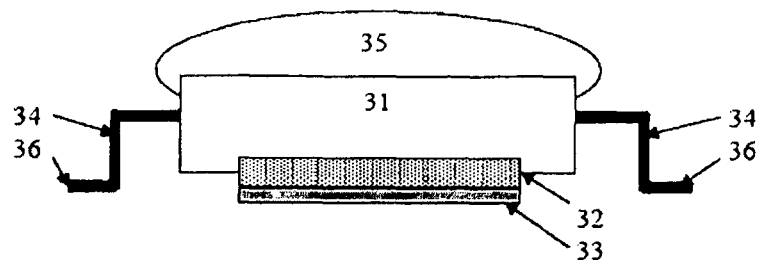
FIG. 1 is a schematic illustration of a prior art light-emitting diode package.
Figure 2:
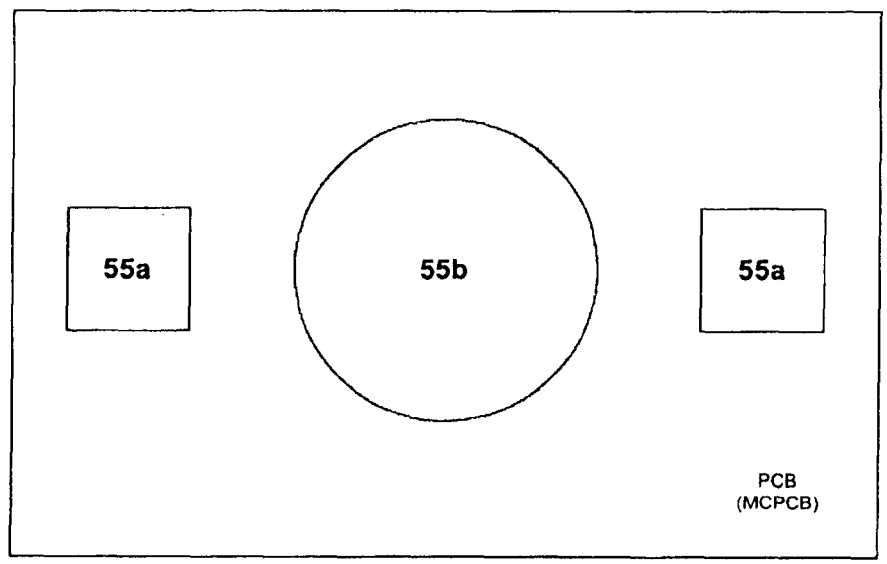
FIG. 2 is a schematic top view of the contact pads on a prior art printed circuit board for receiving an LED package of FIG. 1.

In the first example, LED packages 31 (without lenses 35) and MCPCB's 52 were bonded by the methods of the present disclosure as shown in FIG. 4. The connection leads 34 and center slugs 32 were each electroplated with a 5 µm layer of tin and the copper pads 55 were similarly coated with 5 µm to 7 µm of tin via hot air solder leveling. The connection leads 34 as received were in the gull wing configuration, shown in FIG. 6a. To improve contact between the leads 34 and pads 55a, some leads 34 were conditioned, by methods known in the art, to bring the feet 36 to ±2° of horizontal and co-planar with the base of the LED package 31, similar to FIG. 1. Segments of reactive multilayer foil 51, comprising nickel and aluminum layers with a 1 µm thick Incusil® braze alloy bonding material layer on each outer surface, totaling approximately 40 µm in thickness, were utilized to make the bonds between the connection leads 34, center slug 32, and pads 55. The center slugs 32 were 4 mm in diameter and the copper pads 55b were 4.3 mm in diameter. The connection lead feet 36 were each approximately 2 mm×2 mm after conditioning, and the associated pads 55a were 3 mm×3 mm. For one package, discrete reactive multilayer foil pieces 51a each having dimensions of 2 mm×2 mm were placed between the pads 55a and connection lead feet 36, while a 4 mm diameter reactive multilayer foil disk 51b was placed between pad 55b and the center slug 32. Loading pressure was applied to the upper surface of the LED package 31 via a spring plunger and the reactive multilayer foil disk 51b was ignited to initiate the exothermic reaction. Loading pressure was then applied to one connection lead 34 via a spring plunger and the reactive multilayer foil piece 51a was ignited. Similarly, loading pressure was then applied to the other connection lead 34 via a spring plunger and the other reactive multilayer foil piece 51a was ignited. The exothermic reaction of each reactive multilayer foil piece generated sufficient thermal energy to melt the surrounding bonding materials, which subsequently solidified to form the intended bonds between the respective contacts.

Similar bonds were made wherein only the copper slug 32 was bonded to pad 55b and the shear strength was tested. Table 1 below shows the effect of pressure and reactive multilayer foil thickness on bond strength.

TABLE 1

| | Foil Thickness (µm) | Foil Shape | Joining Pressure (MPa) | Average Shear Strength (MPa) | Std. Dev. of Shear Strength |
|---|---|---|---|---|---|
| 1 | 40 | 4 mm × 4 mm square | 1.38 | 32.78 | 8.60 |
| 2 | 30 | 4 mm × 4 mm square | 1.38 | 13.78 | 7.96 |
| 3 | 30 | 4 mm × 4 mm square | 2.76 | 18.58 | 8.43 |
| 4 | 40 | 3.9 mm diameter disk | 1.38 | 34.30 | 4.80 |

Similar center slug bonds were made using MCPCB's that were coated with a 1 µm layer tin via an immersion tin process on the connection pads 55b. Table 2, below, shows the effect of pressure on bond strength when only 1 µm of tin is on the connection pad 55b. Reactive multilayer foil pieces with 1 µm Incusil on each side and with 1 µm Incusil plus 4 µm pure tin on each side applied via electroplating were used. Four millimeter diameter disks of reactive multilayer foil were used for these tests.

TABLE 2

| | Foil Thickness (µm) | Foil Surface Layer | Joining Pressure (MPa) | Average Shear Strength (MPa) | Std. Dev. of Shear Strength |
|---|---|---|---|---|---|
| 1 | 40 | 1 µm Incusil | 1.38 | 3.47 | 1.37 |
| 2 | 40 | 1 µm Incusil | 4.14 | 12.2 | 4.98 |
| 3 | 40 | 1 µm Incusil | 7.09 | 38.3 | 3.86 |
| 4 | 40 | 4 µm Sn | 2.13 | 47.6 | 1.03 |
| 5 | 40 | 4 µm Sn | 7.09 | 49.1 | 1.79 |

Figure 8:
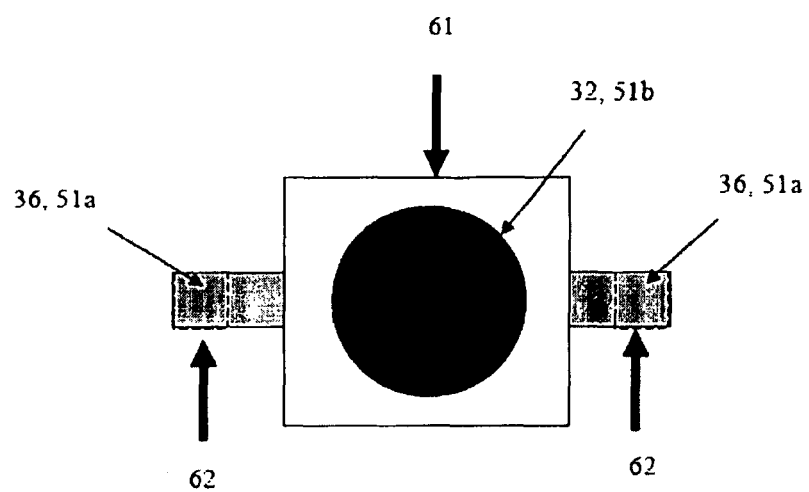
FIG. 8 shows an arrangement for testing the shear strength of a bonded LED package.

In a separate set of tests, the connection leads 34 were bonded to pads 55a using the methods of the present invention and shear tested. The connection leads 34 were originally in the gull-wing configuration as shown in FIG. 5a, but were conditioned as described above to provide increased contact area. The reactive multilayer foil 51 used was 40 µm thick, with 1 µm Incusil on each side, as described above. The shear test geometry is illustrated in FIG. 8, with a load 61 applied to the center of the side of the LED package 31 and balanced by forces 62 on the two connection lead bonds. Table 3, below, shows shear strength for one lead bond under three conditions: first, in the gull-wing shape, second in a conditioned configuration, and third in a conditioned configuration with double the joining pressure.

TABLE 3

| Leads | Joining Pressure (MPa) | Average Bonded Area in²/mm² | Average Shear Fracture Load (lbs/kg) | Average Shear Strength (MPa) | Std. Dev. of Shear Strength |
|---|---|---|---|---|---|
| Gull-wing | 5.7 | 0.00120/0.774 | 3.33/1.51 | 9.95 | 5.44 |
| Conditioned | 3.5 | 0.00394/2.54 | 7.35/3.33 | 6.58 | 0.96 |
| Conditioned | 7.3 | 0.00380/2.45 | 7.57/3.43 | 6.57 | 1.31 |

As can been seen from Table 3, above, conditioning the connection leads 34 to increase contact surface area greatly increased the average shear fracture load, but not the average shear strength, since the bond area was much greater when the leads were conditioned, however, the uncertainty in the shear strength dropped considerably when the leads were conditioned, indicating much improved consistency and repeatability. Doubling the load from the second case to the third case made almost no difference in either shear load or shear strength.

It can now be seen that in one aspect the present disclosure sets forth an improved method for bonding an electronic device, such as a light emitting diode (LED) package 31, to a supporting substrate 52 such as a printed circuit board. The method comprises providing the electronic device or LED package 31 including at least two electrical connection leads 34 and a thermal path (e.g. the copper slug) 32 for transferring heat from the device 31 to the supporting substrate 52, and further providing the supporting substrate 52 for securing the device or LED package 31 and for extracting heat from it. The supporting substrate 52 preferably includes a thermal sink, connection pads 55a for electrically connecting to the package connection leads 34, and a connection pad 55b for thermally coupling the thermal sink to the thermal path. The thermal path of the electronic device or LED package 31 is thermally coupled to the heat sink by the process of disposing between the thermal path and the heat sink, one or more layers of bonding material, such as solder or braze, together with a piece of a reactive multilayer foil 51, and by subsequently triggering an exothermic reaction in the reactive multilayer foil 51 to generate sufficient thermal energy to melt the bonding material, forming a bond between the thermal path and the connection pad associated with the heat sink. Advantageously the package connection leads 34 are also electrically connected to the substrate pads 55a by layers of bonding material such as solder or braze melted by the initiation of an exothermic reaction of an interposed piece of reactive multilayer foil 51. The thermal and electrical connections are thus achieved without significantly raising the temperature of the electronic package or thermally damaging the LED semiconductor electronics or other heat sensitive materials such as polymers in the electronic package 31 or supporting substrate 52.

In another aspect the present disclosure provides an improved light emitting diode (LED) assembly that comprises an LED package, a supporting substrate, and an interconnecting bonding layer between the LED package and the supporting substrate. The LED package includes an LED component, at least two electrical leads to the LED component, and thermal path (e.g. the copper slug) for coupling heat from the LED to a thermal sink in the supporting substrate. The substrate for supporting the LED package comprises the thermal sink, connection pads for electrically connecting to the package leads, and a pad for thermally connecting the thermal sink to the thermal path. The bonding layers, disposed between each of the electrical leads, thermal path, and associated pads on the supporting substrate each comprise a layer of solder or braze and the reaction products resulting from the exothermic reaction of a piece of reactive multilayer foil.

In summary, in one embodiment the present disclosure sets forth a method for bonding an electronic package having at least one electrically or thermally conductive contact to a supporting substrate having at least one associated electrically or thermally conductive contact disposed in a bonding region, comprising: coating each of said contacts with a layer of bonding material; disposing a reactive multilayer foil between each of said contacts of said electronic package and said associated contacts of said supporting substrate; applying a pressure to said contacts in the bonding region; and initiating an exothermic reaction in said reactive multilayer foil, said exothermic reaction resulting in the formation of a bond containing said bonding material and the remains of said reactive multilayer foil between said electronic package contact and said associated substrate contact.

In an alternate embodiment, the present disclosure sets forth a bonded electronic assembly, comprising: an electronic package having at least one electrically or thermally conductive contact lead coated with a first bonding material; a supporting substrate comprising at least one electrically or thermally conductive contact pad coated with a second bonding material, and the remains of a reactive multilayer foil disposed within at least one bond formed between said contact lead and said contact pad by said first and second bonding materials.

In an alternate method, the present disclosure sets forth a method for bonding a temperature-sensitive electronic package having at least one contact to a supporting substrate receiving contact disposed in a bonding region, comprising: disposing a reactive multilayer foil between said contact of said electronic package and said associated receiving contact of said supporting substrate; applying a controlled pressure to said layer of reactive multilayer foil through said contacts; and initiating an exothermic reaction in said reactive multilayer foil, said exothermic reaction resulting in the formation of a bond containing the remains of said reactive multilayer foil between said electronic package contact and said associated substrate receiving contact.

It will be recognized that various aspects of the present disclosure can be embodied in-part in the form of computer-implemented processes and apparatuses for practicing those processes. These may include, but are not limited to, computer controlled application of pressure to the various contact regions during the bonding process. The present disclosure can also be embodied in-part in the form of computer program code containing instructions embodied in tangible media, such as floppy diskettes, CD-ROMs, hard drives, or an other computer readable storage medium, wherein, when the computer program code is loaded into, and executed by, an electronic device such as a computer, micro-processor or logic circuit, the device becomes an apparatus for practicing the present disclosure.

The present disclosure can also be embodied in-part in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the present disclosure. When implemented in a general-purpose microprocessor, the computer program code segments configure the microprocessor to create specific logic circuits.

As various changes could be made in the above constructions without departing from the scope of the disclosure, it is intended that all matter contained in the above description or shown in the accompanying drawings shall be interpreted as illustrative and not in a limiting sense.

The invention claimed is:

1. A bonded electronic assembly, comprising:
   an electronic package having at least one electrically or thermally conductive contact lead coated with a first bonding material;
   a supporting substrate comprising at least one electrically or thermally conductive contact pad coated with a second bonding material, and
   the remains of a reactive multilayer foil disposed within at least one bond formed between said contact lead and said contact pad by said first and second bonding materials;
   at least one electrically or thermally conductive slug coated with the first bonding material;

a second supporting substrate comprising at least one electrically or thermally conductive contact pad coated with the second bonding material; and the remains of the reactive multilayer foil disposed within at least one bond formed between said slug and said contact pad by said first and second bonding materials.

* * * * *